US010763764B2

(12) United States Patent
Hiroki (10) Patent No.: US 10,763,764 B2
(45) Date of Patent: Sep. 1, 2020

(54) STAGE AND SUBSTRATE PROCESSING APPARATUS

(71) Applicant: TOKYO ELECTRON LIMITED, Tokyo (JP)

(72) Inventor: Tsutomu Hiroki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 315 days.

(21) Appl. No.: 15/815,447

(22) Filed: Nov. 16, 2017

(65) Prior Publication Data
US 2018/0138835 A1 May 17, 2018

(30) Foreign Application Priority Data
Nov. 16, 2016 (JP) .................. 2016-223263

(51) Int. Cl.
| H02N 13/00 | (2006.01) |
| F28C 3/00 | (2006.01) |
| H01L 21/683 | (2006.01) |
| H01L 21/67 | (2006.01) |
| F28D 1/04 | (2006.01) |
| B05C 11/00 | (2006.01) |
| B05B 5/025 | (2006.01) |

(52) U.S. Cl.
CPC ............ *H02N 13/00* (2013.01); *F28C 3/005* (2013.01); *F28D 1/04* (2013.01); *H01L 21/67103* (2013.01); *H01L 21/67109* (2013.01); *H01L 21/6831* (2013.01); *B05B 5/025* (2013.01); *B05C 11/00* (2013.01); *H01L 21/67069* (2013.01); *H01L 21/6833* (2013.01)

(58) Field of Classification Search
USPC ......................................... 361/234
See application file for complete search history.

(56) References Cited

U.S. PATENT DOCUMENTS

| 5,683,537 A * | 11/1997 | Ishii ................... H01J 37/32082 156/345.33 |
| 6,965,506 B2 * | 11/2005 | Howald ............ H01L 21/67242 361/234 |
| 2003/0107866 A1 * | 6/2003 | Lee ..................... H01L 21/6831 361/234 |
| 2004/0065259 A1 | 4/2004 | Inazumachi et al. |

(Continued)

FOREIGN PATENT DOCUMENTS

| JP | H10-284382 A | 10/1998 |
| JP | 2003-077996 A | 3/2003 |

(Continued)

*Primary Examiner* — Danny Nguyen
(74) *Attorney, Agent, or Firm* — Fenwick & West LLP (57) ABSTRACT

A stage includes a heat exchanger, a plate provided on the heat exchanger and including a first main surface and a second main surface opposite to each other, the plate having a plurality of through-holes extending in a plate thickness direction, and an electrostatic chuck having a top surface on which a substrate is mounted and a bottom surface attached to the first main surface. The heat exchanger includes a plurality of first tubes having a plurality of opening ends facing a plurality of regions on the bottom surface which are exposed to the respective through-holes and a plurality of second tubes communicating with the through-holes.

8 Claims, 7 Drawing Sheets

(56) References Cited

U.S. PATENT DOCUMENTS

| | | | | |
|---|---|---|---|---|
| 2014/0301010 A1* | 10/2014 | Hayahara | .......... | H01L 21/67109 |
| | | | | 361/234 |
| 2015/0179485 A1* | 6/2015 | Hiroki | ................ | H01L 21/6831 |
| | | | | 165/61 |
| 2016/0035544 A1* | 2/2016 | Lubomirsky | ..... | H01J 37/32082 |
| | | | | 156/345.27 |

FOREIGN PATENT DOCUMENTS

| JP | 2004-104113 | | 4/2004 |
|---|---|---|---|
| JP | 2014-053481 | A | 3/2014 |
| KR | 10-2015-0075037 | A | 7/2015 |

\* cited by examiner

STAGE AND SUBSTRATE PROCESSING APPARATUS

CROSS-REFERENCE TO RELATED APPLICATIONS

This application claims priority to Japanese Patent Application No. 2016-223263 filed on Nov. 16, 2016, the entire contents of which are incorporated herein by reference.

FIELD OF THE INVENTION

The disclosure relates to a stage and a substrate processing apparatus.

BACKGROUND OF THE INVENTION

A substrate processing apparatus includes a stage for supporting a substrate in a depressurizable processing chamber. The stage has a function of controlling a temperature of the substrate. An example of the stage is disclosed in Japanese Patent Application Publication No. 2004-104113.

The stage disclosed in Japanese Patent Application Publication No. 2004-104113 has an electrostatic chuck for attracting and holding a substrate. A cooling plate is attached to a bottom surface of the electrostatic chuck through an adhesive layer. A flow channel through which a coolant circulates is formed in the cooling plate. The stage controls a temperature of the substrate held on the electrostatic chuck by circulating the coolant through the flow channel formed in the cooling plate.

Generally, a material forming the adhesive layer has low thermal conductivity. Therefore, when the adhesive layer is provided between the electrostatic chuck and the cooling plate as in the case of the stage disclosed in Japanese Patent Application Publication No. 2004-104113, the efficiency of heat exchange between the electrostatic chuck and the cooling plate is decreased. Accordingly, in this technical field, it is required to increase the efficiency of heat exchange between the heat transfer medium and the electrostatic chuck in the stage.

SUMMARY OF THE INVENTION

In view of the above, the disclosure provides a stage and a substrate processing apparatus.

In accordance with an aspect of the disclosure, there is provided a stage including: a heat exchanger; a plate provided on the heat exchanger and including a first main surface and a second main surface opposite to each other, the plate having a plurality of through-holes extending in a plate thickness direction; and an electrostatic chuck having a top surface on which a substrate is mounted and a bottom surface attached to the first main surface. The heat exchanger includes: a plurality of first tubes having a plurality of opening ends facing a plurality of regions on the bottom surface which are exposed to the respective through-holes; and a plurality of second tubes communicating with the through-holes.

In accordance with another aspect of the disclosure, there is provided a substrate processing apparatus including: a chamber main body having a chamber; and the stage, described above, provided in the chamber, and configured to discharge a heat transfer medium supplied from a medium temperature controller from the respective first tubes and return the heat transfer medium discharged from the respective first tubes to the medium temperature controller through the respective second tubes.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, various embodiments will be described in detail with reference to the accompanying drawings. Like reference numerals will be given to like or corresponding parts throughout the drawings. Ratios of dimensions in the drawings do not necessarily coincide with those in practice.

Figure 1:
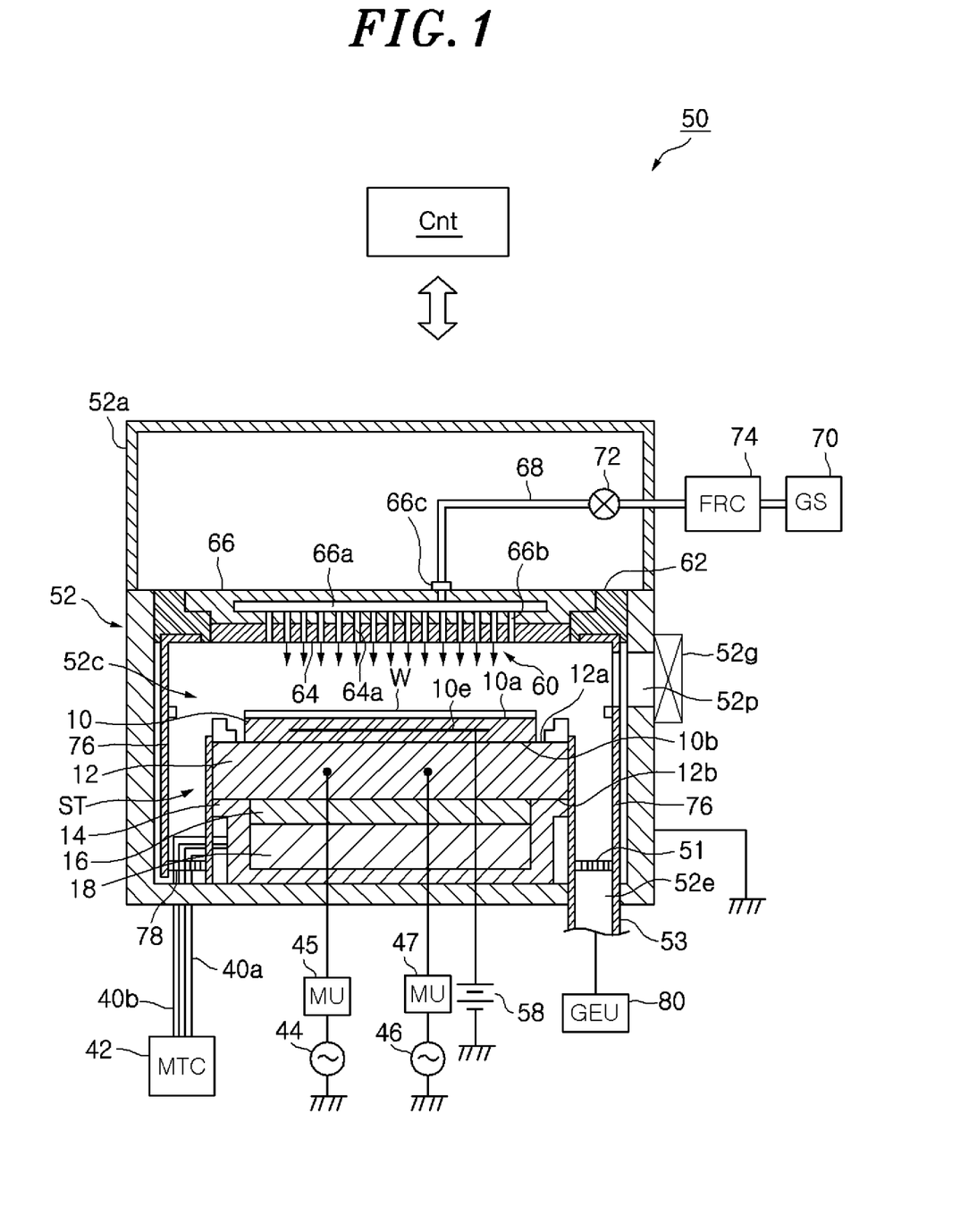
FIG. 1 is a vertical cross sectional view showing a substrate processing apparatus according to an embodiment.

First, a substrate processing apparatus according to an embodiment will be described. FIG. 1 schematically shows the substrate processing apparatus according to the embodiment. Further, FIG. 1 is a partial section view of the substrate processing apparatus. The substrate processing apparatus 50 shown in FIG. 1 is configured as a capacitively coupled plasma processing apparatus.

The substrate processing apparatus 50 includes a chamber main body 52. The chamber main body 52 has a substantially cylindrical shape. An inner space of the chamber main body 52 serves as a chamber 52c. The chamber main body 52 is made of a metal such as aluminum. A plasma resistant film is formed on an inner surface of the chamber main body 52 which faces the chamber 52c. This film is made of aluminum oxide or yttrium oxide. The chamber main body 52 is frame-grounded.

A stage ST is provided on a bottom portion of the chamber main body 52. The stage ST is configured to hold a substrate W mounted thereon. The stage ST includes an electrostatic chuck 10, a plate 12 and a heat exchanger 16. The stage ST will be described in detail later.

The substrate processing apparatus 50 further includes an upper electrode 60. The upper electrode 60 is provided above the stage ST with a space in the chamber 52c therebetween. The upper electrode 60 is supported at an upper portion of the chamber main body 52 through a member 62. The upper electrode 60 may include an electrode plate 64 and a holding body 66. The electrode plate 64 faces the chamber 52c. A plurality of gas injection holes 64a is formed in the electrode plate 64. The electrode plate 64 may be made of a semiconductor or a conductor of low resistance having small Joule's heat. In one embodiment, the electrode plate 64 is grounded. When the electrode plate 64 is grounded, the member 62 has conductivity and is grounded. When a high frequency power supply is connected to the upper electrode 60 as will be described later, an insulating member is used as the member 62.

The holding body 66 detachably holds the electrode plate 64. The holding body 66 may be made of a conductive material, e.g., aluminum. The holding body 66 may have a water cooling structure. A gas diffusion space 66a and a plurality of holes 66b are formed in the holding body 66. The holes 66b extend downward from the gas diffusion space 66a to communicate with the gas injection holes 64a. An inlet port 66c is formed at the holding body 66. The inlet port 66c is connected to the gas diffusion space 66a. A gas supply line 68 is connected to the inlet port 66c.

One or more gas sources (GS) 70 are connected to the gas supply line 68 via one or more valves 72 and one or more flow rate controllers (FRC) 74. Each of the flow rate controllers 74 is a mass flow controller or a pressure control type flow rate controller. One or more gas sources 70 are gas sources of processing gases to be used for processing a substrate in the substrate processing apparatus 50. The processing gases from the gas sources 70 are injected to the chamber 52c through the gas supply line 68, the gas diffusion space 66a, the holes 66b and the gas injection holes 64a.

An opening 52p through which the substrate W is loaded into or unloaded from the chamber 52c is formed at a sidewall of the chamber main body 52. The opening 52p can be opened and closed by a gate valve 52g. A gas exhaust passage is formed between the sidewall of the chamber main body 52 and the stage ST. A baffle plate 51 is provided in the gas exhaust passage. A plurality of holes is formed through the baffle plate 51 in a plate thickness direction thereof.

At the bottom portion of the chamber main body 52, a gas exhaust port 52e is provided below the baffle plate 51. A gas exhaust unit (GEU) 80 is connected to the gas exhaust port 52e through a gas exhaust line 53. The gas exhaust unit 80 includes a pressure controller and a vacuum pump such as a turbo molecular pump or the like.

The substrate processing apparatus 50 further includes a high frequency power supply 44, a matching unit (MU) 45, a high frequency power supply 46 and a matching unit (MU) 47. The high frequency power supply 44 is configured to output a high frequency power for plasma generation. A frequency of the high frequency power outputted from the high frequency power supply 44 is 27 MHz or above, e.g., 40 MHz. The high frequency power supply 44 is connected to the plate 12 through the matching unit 45. The high frequency power outputted from the high frequency power supply 44 is supplied to the plate 12 through the matching unit 45. The matching unit 45 includes a matching circuit for matching an impedance of a load side of the high frequency power supply 44 with an output impedance of the high frequency power supply 44. The high frequency power supply 44 may be connected to the upper electrode 60 through the matching unit 45.

The high frequency power supply 46 is configured to output a high frequency power for attracting ions to the substrate W. A frequency of the high frequency power outputted from the high frequency power supply 46 is 13.56 MHz or less, e.g., 3 MHz. The high frequency power supply 46 is connected to the plate 12 through the matching unit 47. The high frequency power outputted from the high frequency power supply 46 is supplied to the plate 12 through the matching unit 47. The matching unit 47 includes a matching circuit for matching an impedance of a load side of the high frequency power supply 46 with an output impedance of the high frequency power supply 46.

In one embodiment, the substrate processing apparatus 50 further includes a control unit Cnt. The control unit Cnt may be a computer including a processor, a storage device, an input device, a display device and the like. The control unit Cnt controls the respective components of the substrate processing apparatus 50, e.g., a power system, a gas supply system, a driving system and the like. In the control unit Cnt, an operator can input commands or the like by using the input device to manage the substrate processing apparatus 50. Further, in the control unit Cnt, an operational state of the substrate processing apparatus 50 can be visualized and displayed by the display device. The storage device of the control unit Cnt stores a processing recipe and a control program for controlling various processes performed in the substrate processing apparatus 50 by the processor.

Figure 2:
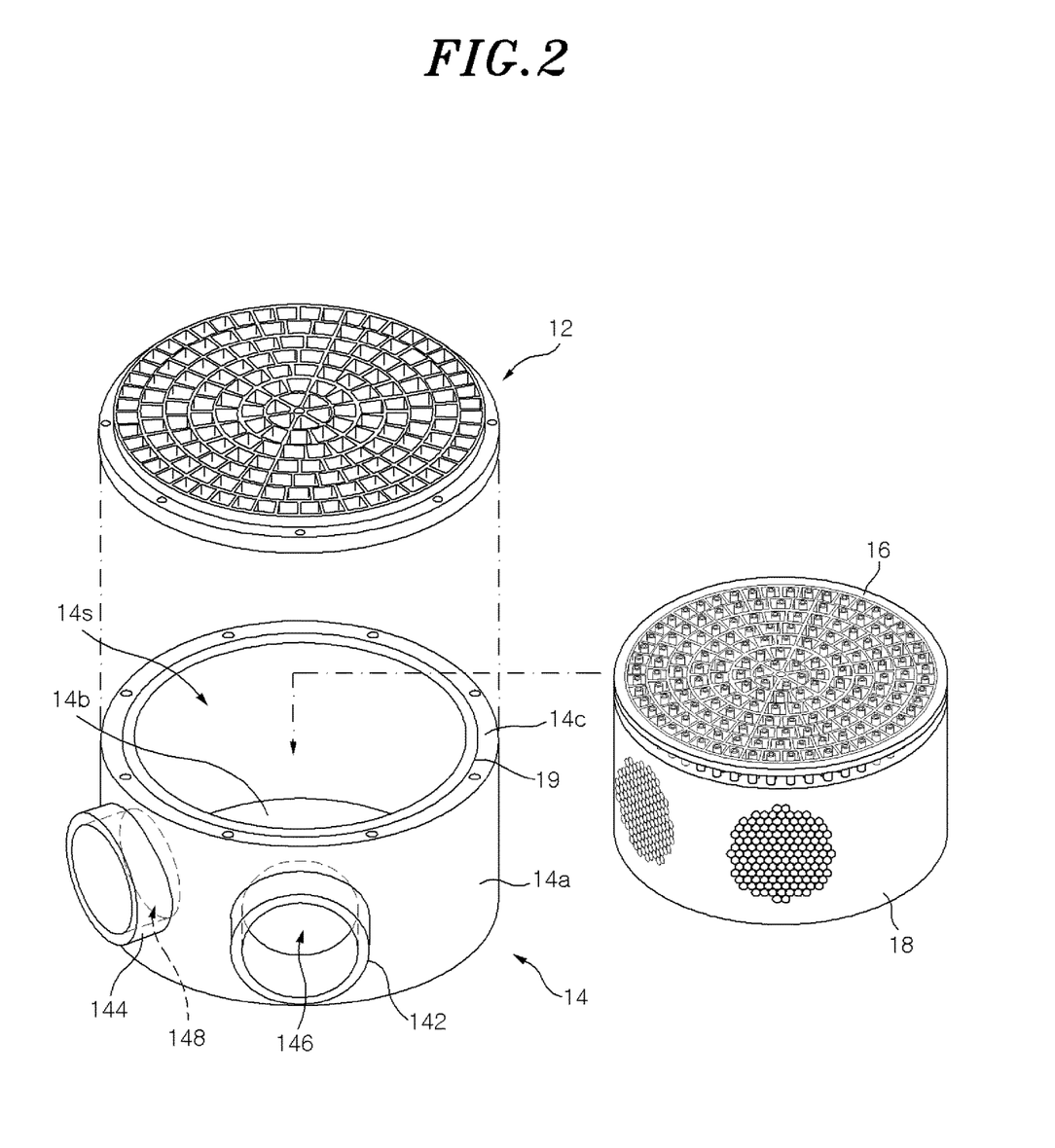
FIG. 2 is an exploded perspective view schematically showing a stage according to an embodiment.
Figure 3:
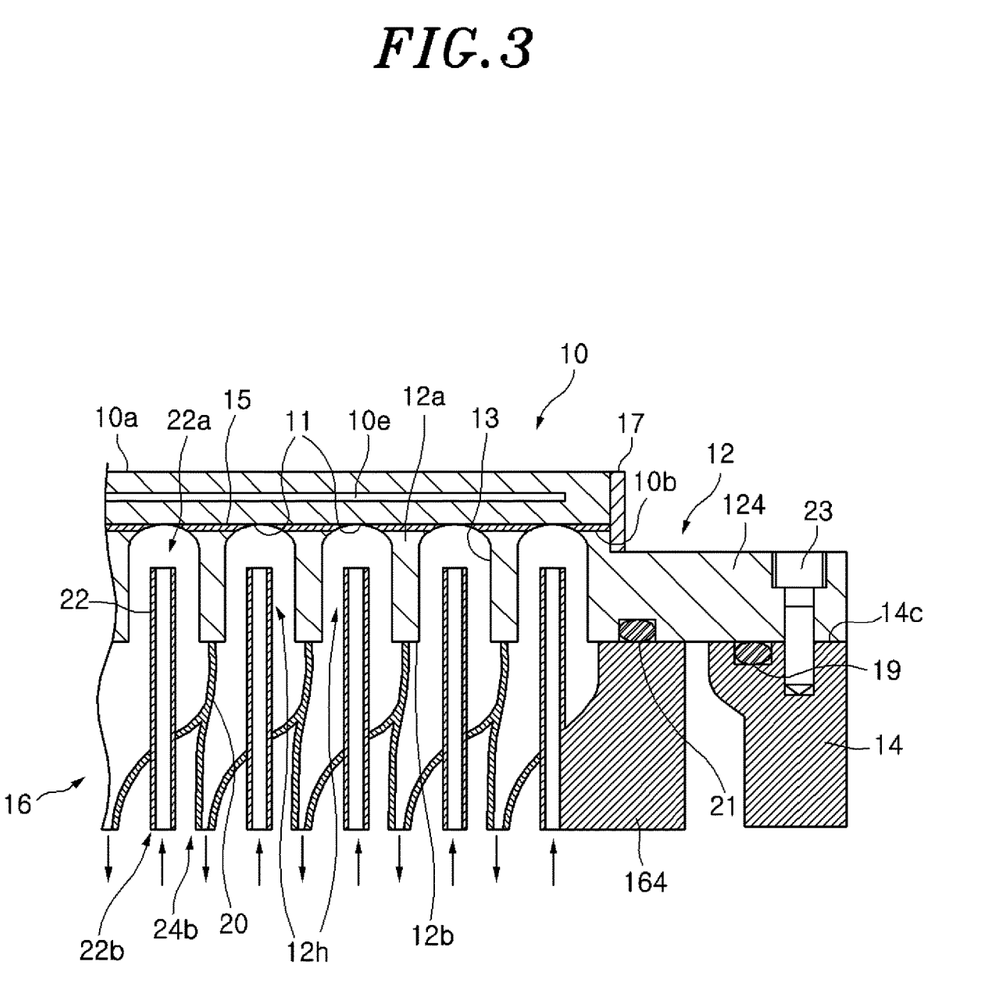
FIG. 3 is an enlarged cross sectional view showing a part of the stage according to the embodiment.

The stage ST will be described in detail with reference to FIGS. 1 to 3. FIG. 2 is an exploded perspective view of the stage ST. FIG. 3 is an enlarged cross sectional view showing a part of the stage ST.

The electrostatic chuck 10 has a substantially disc shape. As shown in FIG. 1, the electrostatic chuck 10 has a top surface 10a and a bottom surface 10b opposite to each other. The substrate W is mounted on the top surface 10a. The electrostatic chuck 10 has a structure in which an electrode 10e made of a conductive film is embedded between two insulating layers or two insulating sheets. The two insulating layers or the two insulating sheets are made of, e.g., ceramic. A DC power supply 58 is electrically connected to the electrode 10e. The substrate W on the top surface 10a can be attracted and held onto the electrostatic chuck 10 by electrostatic force such as Coulomb force or the like which is generated by a DC voltage applied from the DC power supply 58.

Figure 4:
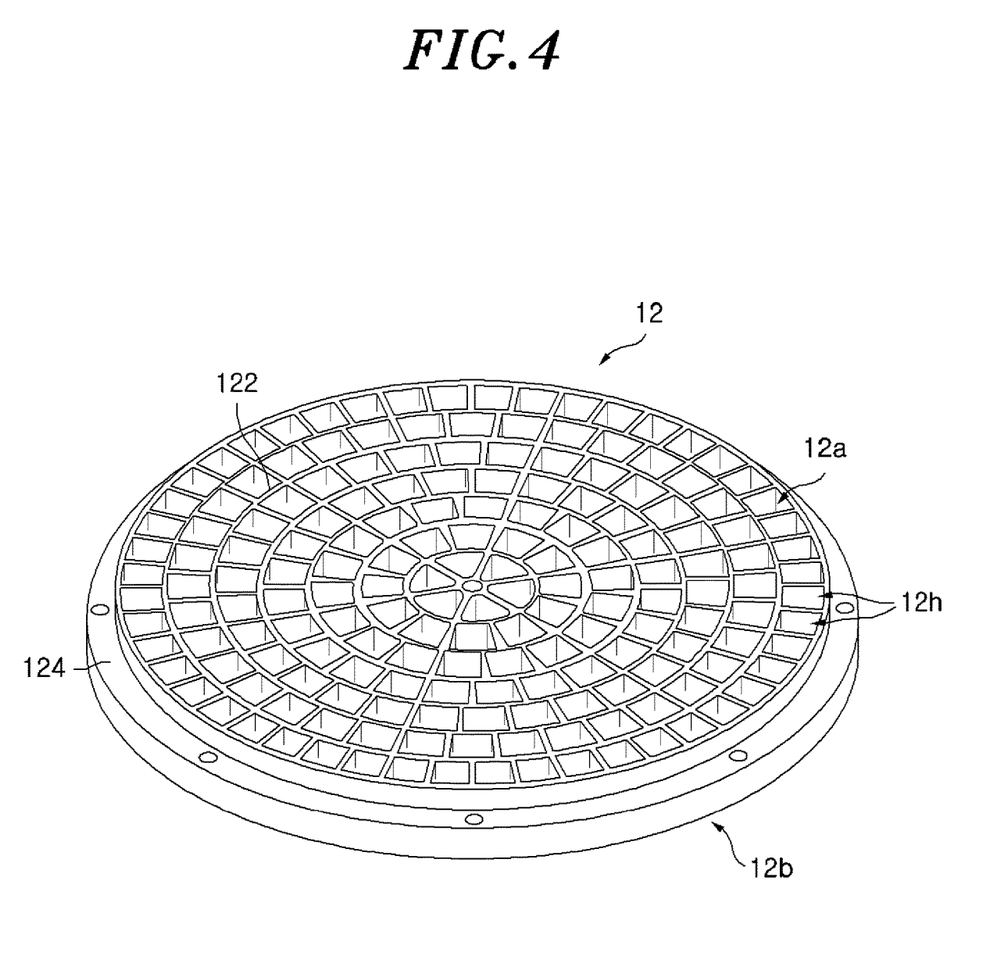
FIG. 4 is a perspective view of a plate according to an embodiment.

The plate 12 made of a metal is provided below the electrostatic chuck 10. The plate 12 has a substantially disc shape and supports the electrostatic chuck 10. Hereinafter, the plate 12 will be described in detail with reference to FIGS. 3 and 4. FIG. 4 is a perspective view of the plate 12. As shown in FIG. 4, the plate 12 has a first main surface (top surface) 12a and a second main surface (bottom surface) 12b opposite to each other. In one embodiment, the plate 12 may include a main portion (first region) 122 and a flange portion (second region) 124. The main portion 122 has a substantially circular shape when seen from the top. The flange portion 124 has an annular shape when seen from the top. The flange portion 124 extends from the main portion 122 to surround an outer periphery of the main portion 122. A plurality of through-holes 12h extending in a direction parallel with a direction from top to bottom of the first main surface 12a and the second main surface 12b, i.e., in a plate thickness direction, is formed in the main portion 122 of the plate 12. Each of the through-holes 12h has a substantially rectangular shape whose width is gradually increased from the center of the plate 12 toward the outer periphery of the plate 12 when seen from the top. The through-holes 12h are two-dimensionally arranged below the electrostatic chuck 10 without being overlapped with each other. Upper openings (openings formed at the first main surface 12a) of the through-holes 12h are blocked by the electrostatic chuck 10. Lower openings (opening formed at the second main surface 12b) of the through-holes 12h are opened. The shape of each of the through-holes 12h when seen from the top is not limited to a rectangular shape and may be a circular shape or a polygonal shape such as a triangular shape or a hexagonal shape.

As shown in FIG. 3, the bottom surface 10b of the electrostatic chuck 10 is attached to the first main surface 12a of the plate 12 through an adhesive layer 15. Specifically, regions on the surface of the plate 12, which face the bottom surface 10b and where the through-holes 12h are not formed, become adhesive regions attaching to the bottom surface 10b of the electrostatic chuck 10. A plurality of regions 11 on the bottom surface 10b of the electrostatic chuck 10 which is not attached to the first main surface 12a of the plate 12 is exposed to the through-holes 12h.

In one embodiment, as shown in FIG. 3, among the surfaces of the plate 12, a wall surface 13 may define the respective through-holes 12h in a way that an area of the opening formed at the first main surface 12a in each through-hole 12h becomes smaller than a cross sectional area of each through-hole 12h on a cross section, in parallel with the first main surface 12a, which passes through a space between the opening formed at the first main surface 12a and the opening formed at the second main surface 12b. In other words, an area of the plate 12 on the first main surface 12a, i.e., an area of the adhesive regions of the plate 12 which are adhered to the electrostatic chuck 10, is set to be greater than the area of the main portion 122 of the plate 12 on the cross section, in parallel with the first main surface 12a, at a location between the first main surface 12a and the second main surface 12b. By increasing the area of the plate 12 on the first main surface 12a, the adhesive area between the electrostatic chuck 10 and the plate 12 can be increased. Accordingly, the electrostatic chuck 10 can be stably supported on the plate 12.

In one embodiment, the wall surface 13 of the plate 12 may be partially curved at a region which includes a boundary between the first main surface 12a and the wall surface 13 such that a width of each through-hole 12h becomes gradually smaller toward each opening formed at the first main surface 12a from an intermediate portion between each opening formed at the first main surface 12a (openings formed at one ends of the respective through-holes 12h) and each opening formed at the second main surface 12b (openings formed at the other ends of the respective through-holes 12h). When the wall surface 13 has a curved shape near the boundary between the first main surface 12a and the wall surface 13, the heat transfer medium in the through-holes 12h flows along the curved surface. Accordingly, the heat transfer medium smoothly flows in the through-holes 12h.

In one embodiment, a film 17 may be formed onto the stage ST to cover an outer periphery of the adhesive layer 15. The film 17 is, e.g., an $Al_2O_3$ film formed by thermal spraying. The film 17 protects the adhesive layer 15 from radicals or a plasma generated in the chamber 52c.

The plate 12 may be made of one or more materials selected from various metals. In one embodiment, the plate 12 may be made of stainless steel (e.g., SUS304). Since the stainless steel has low thermal conductivity, it is possible to suppress release of heat from the electrostatic chuck 10 through the plate 12. In another embodiment, the plate 12 may be made of aluminum. Since the aluminum has low resistivity, loss of power can be reduced when the plate 12 is used as a high frequency electrode. In another embodiment, the plate 12 may be made of a titanium-containing material (e.g., a compound containing silicon and titanium). Since the titanium-containing material has low thermal conductivity and low resistivity, it is possible to suppress release of heat from the electrostatic chuck 10 through the plate 12 and also reduce loss of power when the plate 12 is used as a high frequency electrode.

As another example, the electrostatic chuck 10 may be made of AlN ceramic or $Al_2O_3$ ceramic and the plate 12 may be made of a dense composite material containing C, Si and Ti (e.g., a material containing silicon carbide, titanium silicon carbide and titanium carbide). The electrostatic chuck 10 and the plate 12 may be bonded by thermal compression bonding (TCB). A difference in coefficients of linear thermal expansion between the dense composite material and AlN or $Al_2O_3$ is extremely small. A thermal conductivity, a density and a strength of the dense composite material are considerably high. Therefore, a member, in which the electrostatic chuck 10 made of AlN ceramic or $Al_2O_3$ ceramic and the plate 12 made of the dense composite material are bonded to each other, has an increased lifetime while maintaining a high thermal conductivity.

Further, even if this member is repeatedly used between a low temperature and a high temperature, the electrostatic chuck 10 and the plate 12 are not separated from each other.

Since the electrostatic chuck 10 made of AlN ceramic or $Al_2O_3$ ceramic and the plate 12 made of the dense composite material are bonded to each other by TCB, the bonding therebetween can be comparatively easily performed and an excellent thermal conductivity can be obtained.

Figure 5:
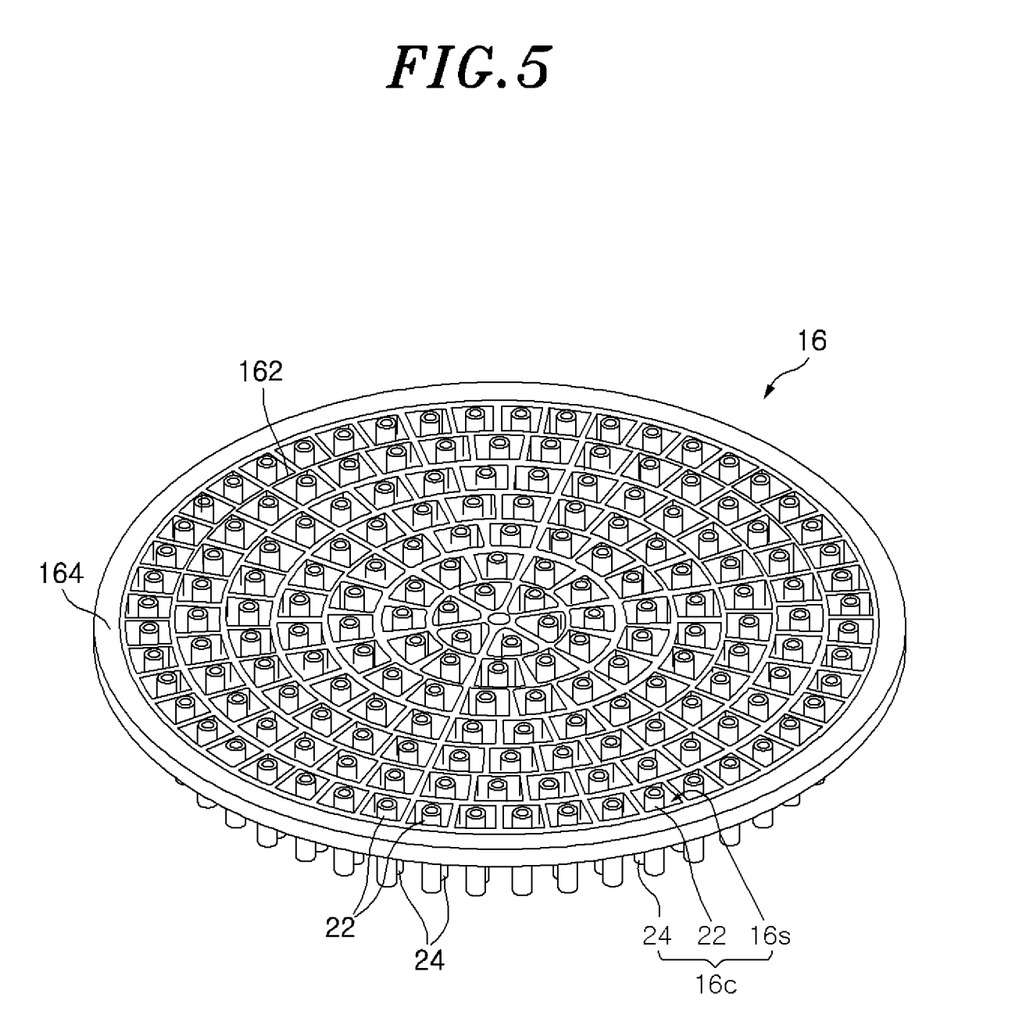
FIG. 5 is a perspective view of a heat exchanger according to an embodiment.
Figure 6A:
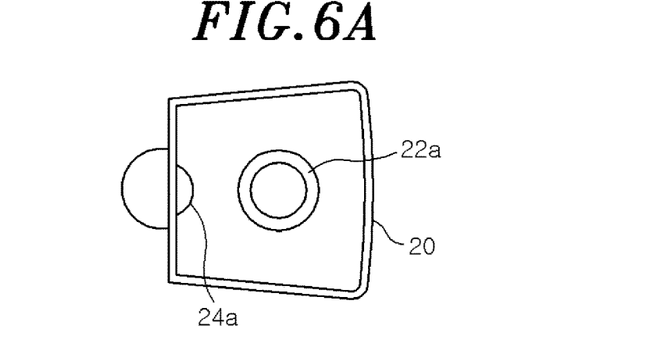
FIGS. 6A to 6C are a top view of a cell unit of the heat exchanger, a perspective view of the cell unit and another perspective view of the cell unit, respectively.
Figure 6B:
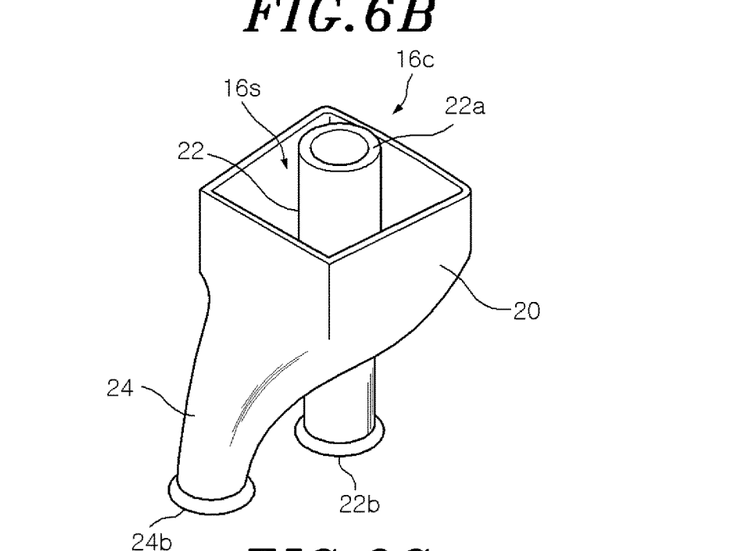
Figure 6C:
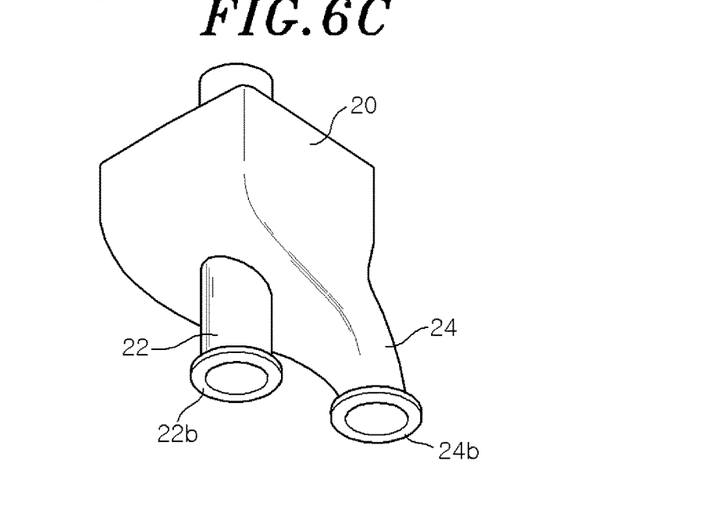

The heat exchanger 16 is provided below the plate 12. The heat exchanger 16 has a substantially disc shape. The plate 12 is supported on the heat exchanger 16. The heat exchanger 16 will be described with reference to FIGS. 3, 5 and 6A to 6C. FIG. 5 is a perspective view of the heat exchanger 16. FIG. 6A is a top view of a cell unit of the heat exchanger shown in FIG. 5. FIG. 6B is a perspective view of the cell unit. FIG. 6c is another perspective view of the cell unit.

The heat exchanger 16 includes a plurality of first tubes 22, a plurality of second tubes 24 and a partition wall 20. In one embodiment, the heat exchanger 16 may include a main portion (first region) 162 and a flange portion (second region) 164. The main portion 162 is a region having a substantially circular shape when seen from the top. The flange portion 164 is a region having an annular shape when seen from the top. The flange portion 164 extends from the main portion 162 to surround an outer periphery of the main portion 162. As shown in FIG. 3, the flange portion 164 of the heat exchanger 16 is disposed to face the flange portion 124 of the plate 12. An O ring 21 is disposed between the flange portion 164 and the flange portion 124. The O ring 21 is provided for sealing a gap between the flange portion 164 and the flange portion 124 while being pressed between the flange portion 164 and the flange portion 124. Since the gap between the flange portion 164 and the flange portion 124 is sealed by the O ring 21, it is possible to prevent the leakage of the heat transfer medium from the gap.

The main portion 162 of the heat exchanger 16 has a plurality of cell units 16c. The cell units 16c are respectively disposed below the through-holes 12h of the plate 12. Each of the cell units 16c may have a substantially rectangular shape whose width is gradually increased from the center of the heat exchanger 16 toward the outer side when seen from the top. Each of the cell units 16c has a substantially rectangular space 16s when seen from the top. The spaces 16s of the cell units 16c are defined by the partition wall 20. The spaces 16s are two-dimensionally arranged below the plate 12 to respectively communicate with the through-holes 12h. The shape of each of the cell units 16c when seen from the top is not limited to a rectangular shape and may be a circular shape or a polygonal shape such as a triangular shape or a hexagonal shape.

As shown in FIGS. 5 and 6A to 6C, each of the cell units 16c includes one of the first tubes 22 and one of the second tubes 24. In each of the cell units 16c, the first tube 22 extends such that the central axis thereof coincides with the central axis of the space 16s. The first tubes 22 extend in parallel to one another. Each of the first tubes 22 has a first opening end 22a and a second opening end 22b. Each of the first tubes 22 extends from the second opening end 22b to the first opening end 22a toward the electrostatic chuck 10. The first openings 22a of the first tubes 22 are positioned in the through-holes 12h formed above the spaces 16s corresponding thereto. The first opening ends 22a are respectively arranged to face the regions 11 of the bottom surface 10b which are exposed to inner spaces of the through-holes 12h.

In each of the cell units 16c, the partition wall 20 is formed to surround an outer peripheral surface of the first tube 22 such that the space 16s can be provided around the outer peripheral surface of the first tube 22. In each of the cell units 16c, the partition wall 20 is extended to connect with the outer peripheral surface of the first tube 22 at a certain position between the first opening end 22a and the second opening end 22b, so that the bottom of the space 16s around the first tube 22 is closed by the partition wall 20. In each of the cell units 16c, the partition wall 20 allows the space 16s to be opened at the side opposite to the bottom of the space 16s. Further, in each of the cell units 16c, the second opening end 22b of the first tube 22 is positioned at the outside of the space 16s. Each of the first tubes 22 serves as a nozzle for discharging the heat transfer medium supplied from a medium temperature controller (MTC) 42 to be described later into the stage ST.

Each of the second tubes 24 has a first opening end 24a and a second opening end 24b. In each of the cell units 16c, the first opening end 24a of the second tube 24 is connected to the partition wall 20 such that a flow path of the second tube 24 communicates with the bottom of the space 16s. In other words, the second tubes 24 communicate with the through-holes 12h through the spaces 16s. In each of the cell units 16c, the second opening end 24b of the second tube 24 is positioned at the outside of the space 16s. In each of the cell units 16c, the second tube 24 serves as a line for discharging to the outside of the space 16s the heat transfer medium that has been discharged from the first tube 22 and returned to the space 16s.

In one embodiment, the heat exchanger 16 may be made of a material mainly including resin, ceramic or a metal. For the purpose of reducing the affect, which may occur between the adjacent cell units 16c, the heat exchanger 16 may be made of a material having low thermal conductivity, e.g., ceramic or resin. Further, a part of the heat exchanger 16 may be made of different materials so that the intensity and/or the thermal conductivity of the heat exchanger 16 can be partially changed. The heat exchanger 16 may be formed by using, e.g., a 3D printer.

In one embodiment, as shown in FIGS. 1 and 2, the stage ST may further include a case 14 and a flow path unit 18.

The case 14 is made of a metal, e.g., stainless steel. The case 14 has a sidewall 14a and a bottom wall 14b. An accommodating space 14s is defined in the case 14. The sidewall 14a has a cylindrical shape and supports the plate 12 on an upper end surface 14c thereof. A supply line 142 and a return line 144 are provided at the sidewall 14a. The supply line 142 extends along a radial direction of the sidewall 14a and communicates with the accommodating space 14s through a first opening 146. The return line 144 extends along the radial direction of the sidewall 14a and communicates with the accommodating space 14s through a second opening 148. The heat exchanger 16 and the flow path unit 18 are accommodated in the accommodating space 14s. An O ring 19 extending in an annular shape along the upper end surface 14c may be provided on the upper end surface 14c of the sidewall 14a. As shown in FIG. 3, the O ring 19 is provided between the flange portion 124 and the upper end surface 14c of the case 14. By fixing the flange portion 124 of the plate 12 to the case 14 by screws, the O ring 19 is pressed between the flange portion 124 and the upper end surface 14c to seal the accommodating space 14s.

Figure 7:
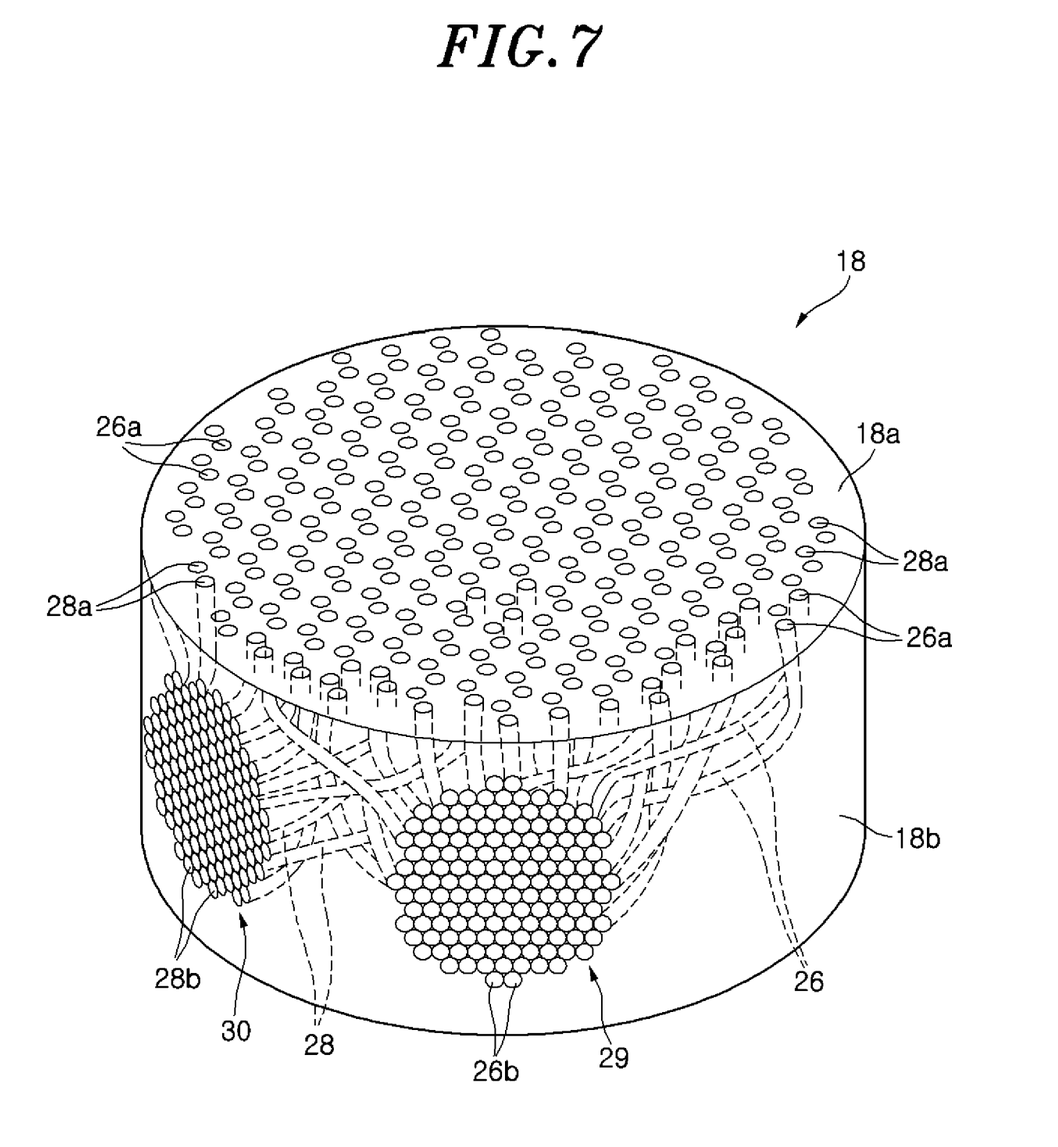
FIG. 7 is a perspective view of a flow path unit according to an embodiment.

Next, the flow path unit 18 will be described with reference to FIG. 7. FIG. 7 is a perspective view of the flow path unit 18. The flow path unit 18 is disposed below the heat exchanger 16 in the accommodating space 14s. The flow path unit 18 provides a flow path for supplying the heat transfer medium to the heat exchanger 16 and a flow path through which the heat transfer medium is returned from the heat exchanger 16.

As shown in FIG. 7, the flow path unit 18 is a substantially cylindrical block. The flow path unit 18 has a top surface 18a and a side surface 18b. In the flow path unit 18, a plurality of first flow paths (supply lines) 26 and a plurality of second flow paths 28 are formed. The first flow paths 26 and the second flow paths 28 are small-diameter cavities extending and penetrating through the flow path unit 18. Each of the first paths 26 has one end 26a and the other end 26b and extends between one end 26a and the other end 26b. One ends 26a of the first paths 26 are formed on the top surface 18a of the flow path unit 18 at positions which correspond to the first tubes 22 of the heat exchanger 16, respectively. One ends 26a are connected to the second opening ends 22b of the first tubes 22, respectively. The other ends 26b of the first paths 26 are locally collected at a first collecting portion 29 formed at the side surface 18b. The first collecting portion 29 is formed at a position corresponding to the first opening 146 of the case 14 and is made to face the first opening 146 while being accommodated in the case 14.

Each of the second flow paths 28 has one end 28a and the other end 28b and extends between one end 28a and the other end 28b. One ends 28a of the second flow paths 28 are formed on the top surface 18a of the flow path unit 18 at positions which correspond to the second opening ends 24b of the second tubes 24, respectively. One ends 28a are connected to the second opening ends 24b of the second tubes 24, respectively. The other ends 28b of the second paths 28 are locally collected at a second collecting portion 30 formed at the side surface 18b. The second collecting portion 30 is formed at a position corresponding to the second opening 148 of the case 14 and is made to face the second opening 148 while being accommodated in the case 14.

The first paths 26 and the second paths 28 are separate paths that do not communicate with each other. In one embodiment, the first paths 26 have the same conductance and the second paths 28 have the same conductance. Here, the conductance is an index indicating flowability of fluid which is determined by a diameter, a length and a refractive index of a flow path. For example, the conductances of the first paths 26 and the second paths 28 become uniform by controlling diameters and refractive indexes of the first paths 26 and the second paths 28 depending on flow path lengths. In one embodiment, the flow path unit 18 may be mainly made of resin. By forming the first paths 26 and the second paths 28 in the block-shaped flow path unit 18, the diameters of the flow paths can be maximized. Accordingly, the conductances of the first paths 26 and the second paths 28 can be increased.

As shown in FIG. 1, one end of a first pipe 40a and one end of a second pipe 40b are connected to the supply line 142 and the return line 144 of the case 14, respectively. The other end of the first pipe 40a and the other end of the second pipe 40b are connected to a supply port and a return port of the medium temperature controller 42 provided at the outside of the chamber main body 52. The medium temperature controller 42 is configured to output a temperature medium controlled to a predetermined temperature from the supply port and return the heat transfer medium returning from the stage ST to the return port. The heat transfer medium having a predetermined temperature is supplied from the medium temperature controller 42 to the stage ST through the first pipe 40a and the second pipe 40b and circulated therein. The heat transfer medium is fluid that circulates in the stage ST to exchange heat with the plate 12. The heat transfer medium includes a coolant that absorbs heat from the plate 12 and a heating medium that transfers heat to the plate 12. As for the heat transfer medium used as the coolant, it is possible to use, e.g., cooling water or fluorine-based liquid. Further, the heat transfer medium is not limited to liquid and there may be employed coolant by phase change cooling using vaporization heat or coolant by gas cooling using a gas.

The heat transfer medium supplied from the medium temperature controller 42 returns to the return port of the medium temperature controller 42 sequentially through the first pipe 40a, the supply line 142, the first flow paths 26, the first tubes 22, the second tubes 24, the second flow paths 28, the return line 144, and the second pipe 40b. By controlling the temperature of the heat transfer medium circulating therethrough, the temperature of the substrate W mounted on the electrostatic chuck 10 is controlled. In one embodiment, the medium temperature controller 42 may be connected to the first flow paths 26 through a plurality of independent pipes and may be configured to individually control the temperatures of the heat transfer medium supplied to the first flow paths 26. Similarly, the medium temperature controller 42 may be connected to the second flow paths 28 through a plurality of independent pipes. In this embodiment, the temperatures of the heat transfer medium discharged from the first pipes 40a can be individually controlled.

Next, the flow of the heat exchange medium will be described with reference to FIG. 3. The heat transfer medium supplied into the stage ST from the first opening 146 by the medium temperature controller 42 passes through the first flow paths 26 of the flow path unit 18 and flows into the first tubes 22 through the second opening ends 22b. The heat transfer medium supplied through the second opening ends 22b moves upward through the first tubes 22 and is discharged from the first opening ends 22a. The heat transfer medium discharged from the first opening ends 22a comes into contact with the regions 11 on the bottom surface 10b of the electrostatic chuck 10. The heat transfer medium in contact with the regions 11 performs heat exchange with the electrostatic chuck 10. The heat transfer medium that has exchanged the heat moves downward along the surface of the partition wall 20 and the wall surface 13 and is discharged to the outside of the heat exchanger 16 from the second opening ends 24b of the second tubes 24. The heat transfer medium discharged from the heat exchanger 16 returns to the medium temperature controller 42 through the second flow paths 28 and the second opening 148.

As described above, in the stage ST, the heat transfer medium discharged from the first tubes 22 comes into direct contact with the regions 11 of the bottom surface 10b of the electrostatic chuck 10. Thus, the heat exchange is performed with high efficiency between the electrostatic chuck 10 and the heat transfer medium. Accordingly, in the case of using the stage ST according to the above embodiment, a temperature of the electrostatic chuck 10 can be controlled with high accuracy and a response speed in controlling the temperature of the electrostatic chuck 10 can be improved.

Further, in the stage ST, the heat transfer medium is individually discharged from the first tubes 22 arranged two-dimensionally and extending in parallel with each other, and the discharged heat transfer medium is collected through the second tubes 24. In other words, the heat exchanger 16 of the stage ST includes a plurality of heat exchange units, each having an individual heat transfer medium flow path. In this heat exchanger 16, the heat transfer medium is individually discharged to the bottom surface 10b of the electrostatic chuck 10 from the first opening ends 22a facing the bottom surface. Therefore, it is possible to suppress the temperature differences which may occur between the heat transfer medium passing through the through-holes 12h.

While the embodiments have been described, the present disclosure is not limited to the above embodiments and may be variously modified. For example, through-holes through which lift pins penetrate may be formed in the electrostatic chuck 10, the plate 12 and the partition wall 20 of the heat exchanger 16. In addition, a backside gas supply line for supplying a cooling gas such as He gas or the like which exchanges heat with the substrate W to the backside of the substrate W may be provided in the stage ST.

In the above embodiments, the heat exchanger 16 and the flow path unit 18 are provided as separate members. However, the heat exchanger 16 and the flow path unit 18 may be formed as one unit.

While the disclosure has been shown and described with respect to the embodiments, it will be understood by those skilled in the art that various changes and modifications may be made without departing from the scope of the disclosure as defined in the following claims.

What is claimed is:

1. A stage comprising:
    a heat exchanger;
    a plate provided on the heat exchanger and including a first main surface and a second main surface opposite to each other, the plate having a plurality of through-holes extending in a plate thickness direction; and
    an electrostatic chuck having a top surface on which a substrate is mounted and a bottom surface attached to the first main surface;
    wherein the heat exchanger includes:
    a plurality of first tubes having a plurality of opening ends facing a plurality of regions on the bottom surface which are exposed to the respective through-holes; and
    a plurality of second tubes communicating with the through-holes,
    wherein an area of the plate on the first main surface is greater than an area of the plate on a cross section, between the first main surface and the second main surface, which is in parallel with the first main surface.

2. The stage of claim 1, wherein the opening ends are positioned in the through-holes, respectively.

3. The stage of claim 1, wherein the plate is made of stainless steel.

4. The stage of claim 1, wherein the plate is made of a titanium-containing material.

5. The stage of claim 1, wherein the plate is made of aluminum.

6. The stage of claim 1, wherein the plate has a first region where the plurality of through-holes are formed and a second region extending from the first region to surround an outer periphery of the first region,
the heat exchanger has a first region where the plurality of first tubes and the plurality of second tubes are formed and a second region extending from the first region to surround an outer periphery of the first region, and
an O ring provided between the second region of the plate and the second region of the heat exchanger to seal a gap between the second region of the plate and the second region of the heat exchanger.

7. The stage of claim 1, wherein a wall surface among surfaces of the plate, which defines the respective through-holes, is partially curved at a region which includes a boundary between the first main surface and the wall surface such that the respective through-holes become gradually smaller toward openings of the respective through-holes which are formed at the first main surface from an intermediate portion between the openings of the respective through-holes which are formed at the first main surface and openings of the respective through-holes which are formed at the second main surface.

8. A substrate processing apparatus comprising:
a chamber main body having a chamber; and
a stage comprising:
a heat exchanger;
a plate provided on the heat exchanger and including a first main surface and a second main surface opposite to each other, the plate having a plurality of through-holes extending in a plate thickness direction; and
an electrostatic chuck having a top surface on which a substrate is mounted and a bottom surface attached to the first main surface;
wherein the heat exchanger includes:
a plurality of first tubes having a plurality of opening ends facing a plurality of regions on the bottom surface which are exposed to the respective through-holes; and
a plurality of second tubes communicating with the through-holes,
wherein the stage is provided in the chamber, and configured to discharge a heat transfer medium supplied from a medium temperature controller from the respective first tubes and return the heat transfer medium discharged from the respective first tubes to the medium temperature controller through the respective second tubes.

* * * * *